United States Patent [19]

Akiyama

[11] Patent Number: 4,873,202
[45] Date of Patent: Oct. 10, 1989

[54] SOLID STATE RELAY AND METHOD OF MANUFACTURING THE SAME

[75] Inventor: Sigeo Akiyama, Neyagawa, Japan

[73] Assignee: Matsushita Electric Works, Ltd., Osaka, Japan

[21] Appl. No.: 268,215

[22] Filed: Nov. 7, 1988

Related U.S. Application Data

[62] Division of Ser. No. 26,994, Mar. 10, 1987, Pat. No. 4,804,866.

[30] Foreign Application Priority Data

Mar. 24, 1986 [JP] Japan ................................. 61-68112
Jun. 16, 1986 [JP] Japan ............................... 61-139911

[51] Int. Cl.$^4$ ........................................... H01L 29/78
[52] U.S. Cl. ......................................... 437/62; 437/2; 437/51; 437/48; 437/79; 437/225; 437/905; 437/911; 437/974; 357/19; 350/96.11
[58] Field of Search ................... 437/974, 2, 3, 62, 79, 437/89, 90, 51, 48, 225, 905, 911; 357/19, 23.4, 29, 30, 49

[56] References Cited

U.S. PATENT DOCUMENTS

| | | | |
|---|---|---|---|
| 3,575,731 | 4/1971 | Hoshi et al. | 437/90 |
| 3,722,079 | 3/1973 | Beasom | 357/49 |
| 3,938,176 | 2/1976 | Sloam, Jr. | 357/49 |
| 4,227,098 | 10/1980 | Brown et al. | |
| 4,307,298 | 12/1981 | El Hamamsy et al. | |
| 4,390,790 | 6/1983 | Rodriguez | |
| 4,393,573 | 7/1983 | Kato et al. | 437/90 |
| 4,419,586 | 12/1983 | Phipps | |
| 4,467,344 | 8/1984 | Chang et al. | 357/39 |
| 4,492,883 | 1/1985 | Janutka | |
| 4,500,801 | 2/1985 | Janutka | |
| 4,631,804 | 12/1986 | Roy | 357/49 |
| 4,665,316 | 5/1987 | Hodges | |
| 4,692,784 | 9/1987 | Negoro | 357/49 |
| 4,742,380 | 5/1988 | Chang et al. | 357/23.4 |
| 4,786,958 | 11/1988 | Bhagat | 357/38 |
| 4,807,012 | 2/1989 | Beasom | 357/49 |

FOREIGN PATENT DOCUMENTS 2154820 9/1985 United Kingdom .

Primary Examiner—Brian E. Hearn
Assistant Examiner—T. Thomas
Attorney, Agent, or Firm—Burns, Doane, Swecker & Mathis

[57] ABSTRACT

A solid state relay includes a MOS FET receiving a photovoltaic output generated across a photovoltaic diode array responsive to a light signal from a light-emitting element, and a normally ON driving transistor connected to the MOS FET, the driving transistor being connected at control electrode to a connection point between the photovoltaic diode array and an impedance element to be biased by a voltage generated across the impedance element during generation of the photovoltaic output across the photovoltaic diode array to have a high impedance state, whereby the relay can be prevented from providing at output terminals any intermediate state between ON and OFF states even when an input current to the relay is in lower range, and a high speed relay operation is realized.

5 Claims, 4 Drawing Sheets

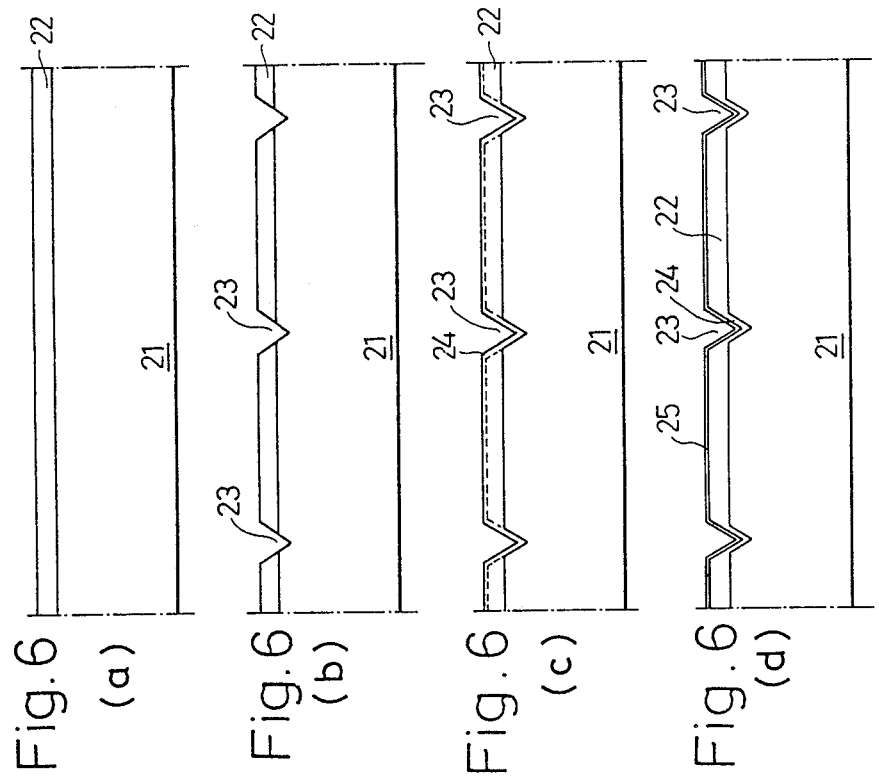
Fig. 6 (a)
Fig. 6 (b)
Fig. 6 (c)
Fig. 6 (d)
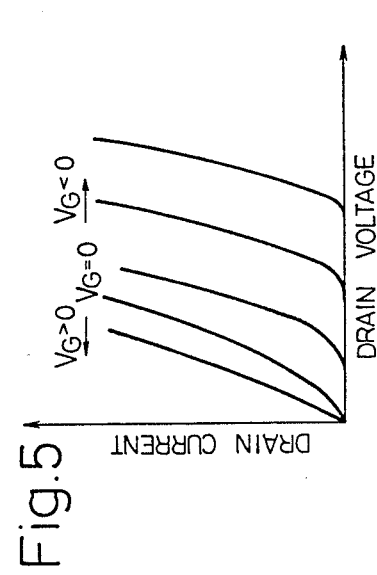
Fig. 5
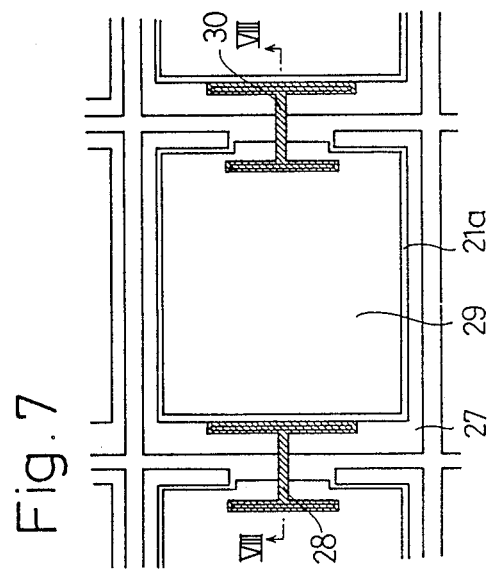
Fig. 7

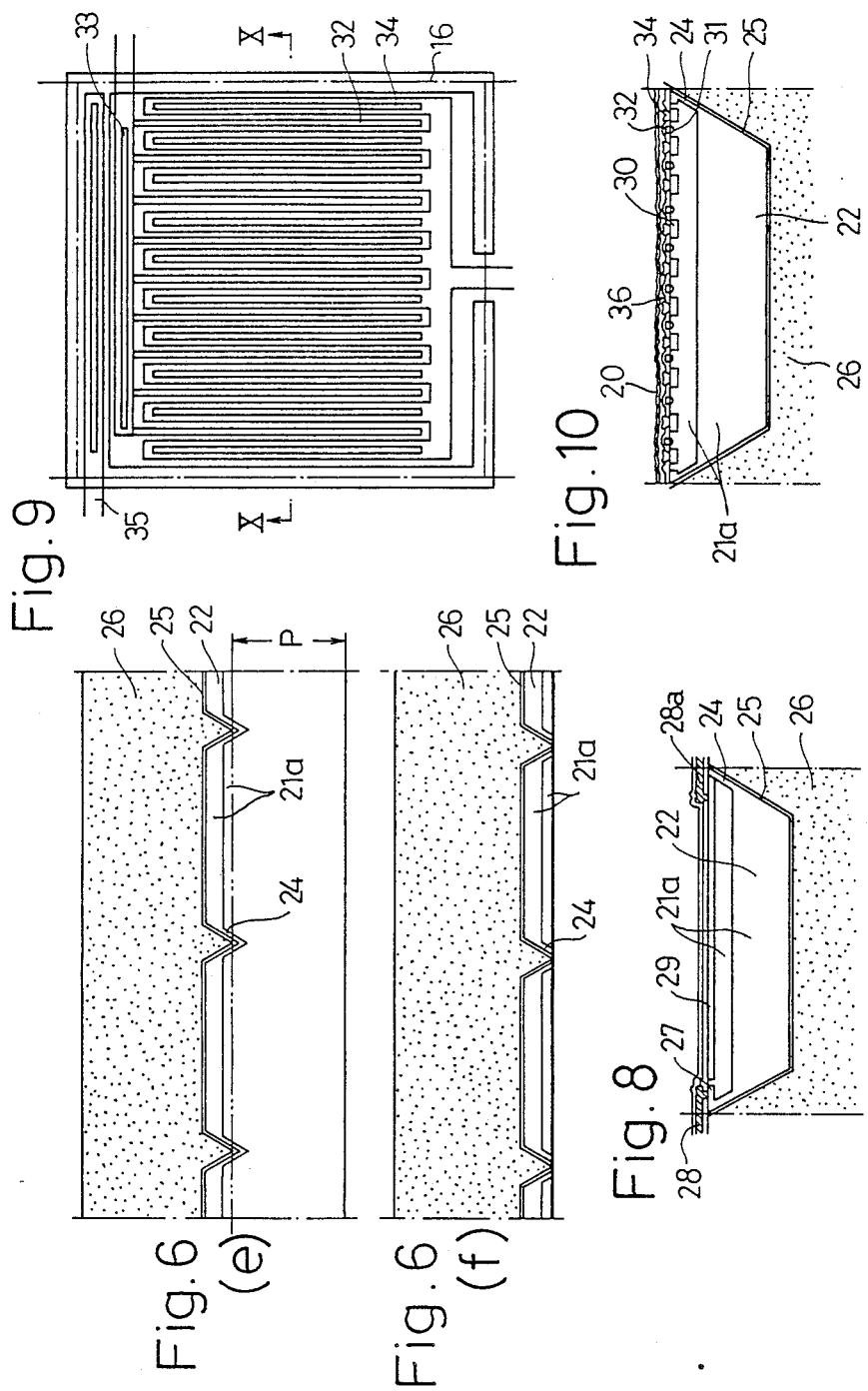

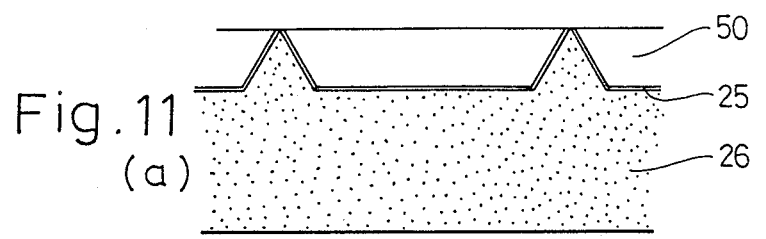
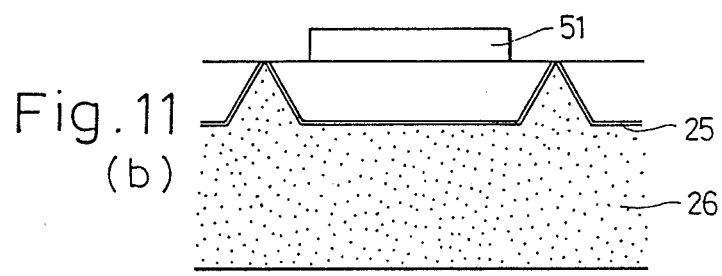
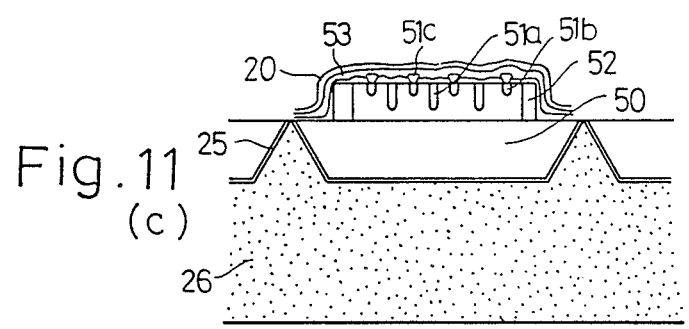
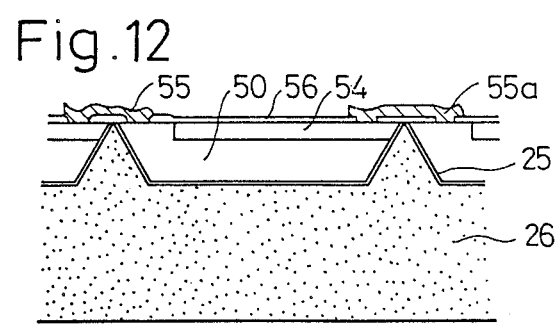

SOLID STATE RELAY AND METHOD OF MANUFACTURING THE SAME

This application is a divisional of U.S. patent application Ser. No. 026,994 filed Mar. 10, 1987, now U.S. Pat. No. 4,804,866.

TECHNICAL BACKGROUND OF THE INVENTION

This invention relates to solid state relays and methods of manufacturing the same and, more particularly, to the solid state relay and manufacturing method of the relay in which a light-emitting diode converts an input signal to a light signal, a photovoltaic diode array optically coupled to the light-emitting diode converts the light signal to an electrical signal which is used for driving a metal-oxide-semiconductor field effect transistor (hereinafter, referred to merely as "MOS FET") as an output means to obtain a contact signal as an output.

DISCLOSURE OF PRIOR ART

There has bee proposed in U.S. Pat. No. 4,227,098 to Dale M. Brown et al. a solid state relay, in which a photovoltaic diode array is optically coupled to a light-emitting diode and the diode array is connected in parallel with a resistor for providing to the array a resistive impedance and in series with gate and substrate electrodes of the MOS FET.

When a current flows across input terminals of the light-emitting diode in this relay, a photovoltaic output is generated across both end terminals of the diode array and is applied across the gate and substrate of the MOS FET, and consequent thereto the impedance of the MOS FET between output terminals connected to current passage electrodes of the MOS FET is remarkably changed to a different value, that is, in the case of MOS FET of enhancement mode, the state across the output terminals is shifted from OFF state to ON state, so that the relay can perform the same function as electromechanical relays, without having any mechanical moving part. At this time, the resistor connected in parallel to the diode array serves to discharge electrostatic charges accumulated between the gate and substrate electrodes of the MOS FET. In the case where this resistor is not present, the state across the output terminals cannot be returned to the OFF state even when the input current to the light-emitting diode is interrupted.

In the foregoing U.S. patent, there has been such a problem that it is necessary to make the value of the resistor large in order to reduce the required minimum input current, i.e., the operating current for turning this solid state relay to be ON, while it is necessary to make the resistance value small in order to shorten the time taken from interruption of the input current to turning OFF of the state across the output-terminals, so that it has been difficult to concurrently achieve these two functions. The patent has also been defective in that, when the input current is in a range of nearby the operating current, the voltage across the gate and substrate electrodes of the MOS FET varies proportionally to the input current, so that the impedance of the MOS FET across the output terminals connected to the current passage electrodes of the FET will take an intermediate value between the values of the ON and OFF states.

Another problem involved in this known relay is that, when the resistor connected in parallel to the photovoltaic diode array is of a too large value, a large voltage variation occurring across the output terminals in the absence of the input current to the input terminals will cause a Mirror's current by parasitic capacitance between the drain and gate of the MOS FET, whereby the gate voltage of the MOS FET is increased so that an instantaneous mistriggering (turning on) will readily occur.

Further, U.S. Pat. No. 4,390,790 to Edward T. Rodriguez discloses a solid state relay in which a photovoltaic diode array optically coupled to a light-emitting diode is connected in series with a MOS FET which has a normally ON junction FET connected between the gate and substrate electrodes of the MOS FET and an additional photovoltaic diode array is connected between the gate and source of the junction FET through a resistor. According to Rodriguez, the instantaneous mistriggering of the MOS FET can be prevented by the provision of the additional diode array for driving the normally-ON junction FET, but the necessity of the additional diode array has been the cause of such problem that a larger chip size is required for forming a driving circuit to render the device to be expensive and the circuit arrangement of combining the junction FET with the additional diode array renders a high speed relay operation to be hardly realizable.

In addition, there is disclosed in U.S. patent application No. 581,785 of Daniel M. Kinzer a solid state relay wherein a photovoltaic diode array optically coupled to a light-emitting diode is connected in parallel with a resistor and a transistor having a diode inserted between its emitter and base and also in series with a MOS FET, and this solid state relay prevents the instantaneous mistriggering of the MOS FET by providing a separate A.C. clamping circuit. While the instantaneous mistriggering can be thus prevented, this known relay has been still disadvantageous in that the required A.C. clamping circuit results in a complicated circuit arrangement as a whole to increase manufacturing costs, and the arrangement including the resistor as a high impedance element confronts with a difficulty in assembling, in particular, a light-receiving and driving circuit section integralized into one chip with other elements into a hybrid IC, since required chip size becomes too large to be so manufactured.

There has been still remained in all of the foregoing known techniques is such a problem that no means is taken for protecting the relay from a surge voltage generated across the gate and substrate electrode of the MOS FET during the presence of the input current, the developed surge voltage tending a risk of a gate breakdown to readily occur.

On the other hand, a turning-OFF circuit for the MOS FET that can be employed in the solid state relay is disclosed in U.S. Pat. No. 4,492,883 to William J. Janutka, wherein another P-channel FET is connected between the gate and substrate electrodes of a MOS FET, a Zener diode is inserted between the gate and source of the P-channel FET, i.e., between the gate of the MOS FET and the gate of the P-channel FET, and a resistor is inserted between the gate and drain of the P-channel FET. According to this arrangement, the instantaneous mistriggering can be prevented.

Because of the use of the Zener diode operating as a threshold voltage breakdown means of the MOS FET and of a leak of gate driving due to the resistor employed, however, it becomes necessary for the high speed turning-ON operation to use a high-voltage and high-current driving power source, which is disadvantageous as a circuit arrangement to be coupled to the photovoltaic diode array.

TECHNICAL FIELD OF THE INVENTION

A primary object of the present invention is, therefore, to provide a solid state relay which can achieve a high speed relay operation equivalent to a snap action of electromechanical relay, with any intermediate state between ON and OFF states prevented from occurring across output terminals in an input current range around an operating current of the relay, can restrain such erroneous operation as instantaneous conduction due to any instantaneously varied voltage applied to the relay output terminals in the absence of the input current, and can protect the gate of MOS FET from a surge voltage generated across the gate and source of MOS FET, and also to provide a method of manufacturing such solid state relay.

According to the present invention, the above object is attained by providing a solid state relay comprising a light-emitting element for generating a light signal in the presence of an input current, a photovoltaic diode array optically coupled to the light-emitting element for receiving the light signal and generating a photovoltaic output, an impedance element connected in series with the photovoltaic diode array, an output MOS FET which varies from a first impedance state to a second impedance state upon application of the photovoltaic output across gate and substrate electrodes of the MOS FET, and a pair of output terminals connected to the gate and substrate electrodes of the MOS FET, wherein a normally ON driving transistor is connected to the MOS FET, the transistor being connected at its control electrode to a connection point between the photovoltaic diode array and the impedance element to be biased to be in a high impedance state by a voltage generated across the impedance element in the presence of the photovoltaic output generated across the photovoltaic diode array.

Other objects and advantages of the present invention shall be made clear in the following description of the invention detailed with reference to preferred embodiments shown in accompanying drawings.

BRIEF EXPLANATION OF THE DRAWINGS

FIG. 5 is a characteristic diagram of a normally ON transistor used in the solid state relay of FIG. 1;

FIGS. 6(a) to 6(f) show steps of manufacturing a dielectric-isolation substrate for the one-chip solid state relay of FIG. 2;

FIG. 7 is a partially magnified plan view of a photovoltaic diode array prepared by the manufacturing steps of FIG. 6;

FIG. 8 is a cross-sectional view taken along line VIII—VIII in FIG. 7;

FIG. 9 is a plan view of a transistor prepared by the manufacturing steps of FIG. 6;

FIG. 10 is a cross-sectional view taken along line X—X in FIG. 9;

FIGS. 11(a) to 11(c) show steps of manufacturing a junction type FET employable in the one-chip solid state relay of FIG. 2; and FIG. 12 is a partially magnified sectional view of a diode array employable in the one-chip solid state relay of FIG. 2.

Figure 1:
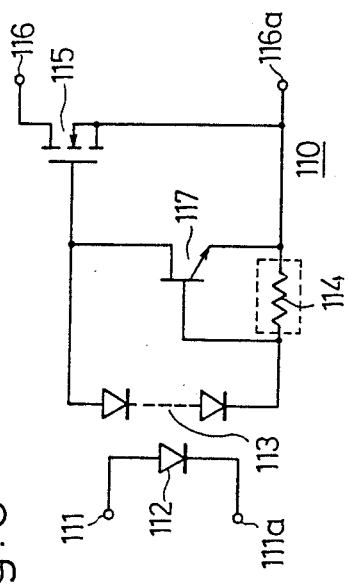
FIG. 1 is a circuit diagram in an embodiment of a solid state relay according to the present invention.

While the present invention shall now be described with reference to the preferred embodiments shown in the drawings, it should be understood that the intention is not to limit the invention only to the particular embodiments shown but rather to cover all alterations, modifications and equivalent arrangements possible within the scope of appended claims.

DISCLOSURE OF PREFERRED EMBODIMENTS

Referring to FIG. 1, a solid state relay 10 according to the present invention includes such a light-emitting element 12 as, preferably, a light-emitting diode which is connected to input terminals 11 and 11a to generate a light signal in response to an input current signal, the light-emitting element 12 being optically coupled to an array 13 of diodes which receive the light signal from the light-emitting element and generate a photovoltaic output. The diode array 13 is connected in series with such an impedance element 14 as a diode, and with a MOS FET 15 which functions to vary its first impedance state to a second impedance state upon application of the photovoltaic output from the diode array 13 across its gate and substrate (source), and this MOS FET 15 is connected with a pair of output terminals 16 and 16a and further with a normally ON driving transistor 17 which is, in the illustrated embodiment, of an N-channel type. The transistor 17 is connected at its conduction electrodes to the gate and substrate of the MOS FET 15 and at its control electrode to a connection point between the diode array 13 and the impedance element 14 so as to be biased to be at high impedance state by a voltage generated across the diode array 13. The transistor 17 may comprise a static induction transistor (SIT) of N-channel and normally ON type or a depletion mode field effect transistor of N-channel type.

In this solid state relay 10, an input current supplied between the input terminals 11 and 11a causes the light-emitting element 12 to generate a light signal in response to which the photovoltaic diode array 13 generates a photovoltaic output across its both terminals, which photovoltaic output is applied across the gate and substrate (source) of the MOS FET 15 and to the normally ON transistor 17, whereby a current which accumulates electrostatic capacitances between the gate and substrate of the MOS FET 15 and another current which flows through the transistor 17 are generated, and these currents flow through the diode 14 as the impedance element. In this case, a terminal voltage across the impedance element 14 biases the gate of the transistor 17 to be at a negative voltage, and this biased voltage renders the transistor 17 to be put momentarily in a high impedance state (turning off), so that the charge operation between the gate and the substrate of the MOS FET 15 can be prevented from being delayed due to the presence of the transistor 17. As a result, the impedance across the output terminals 16 and 16a connected to the MOS FET 15 varies remarkably to be of a different value. It will be appreciated that the diode 14 does not perform any rectification but functions merely as an impedance element.

The solid state relay 10 according to the present invention can realize substantially the same operation as the snap action of an electromechanical relay. That is, when the input current provided between the input terminals 11 and 11a is less than a level predetermined by the gate cut-off (or threshold) voltage of the transistor 17 and voltage characteristics of the impedance element, the transistor 17 maintains its ON state and the impedance across the output terminals 16 and 16a substantially does not change. In other words, if the input current is of a level higher than the predetermined level, then the impedance of the MOS FET across the output terminals 16 and 16a momentarily changes to thus realize the so-called snap action. In this connection, the predetermined level is called an operating current of the relay and, in the absence of such operating current as a limit point, mere use of, for example, a photocoupler or the like causes the impedance value between the output terminals to continuously change depending on the level of the input current to disable such relaying of the snap action.

In the case where the foregoing static induction transistor that exhibits such nonsaturation characteristics as shown in FIG. 5 in the current value $I_D$ between the drain and source is used as the transistor 17, an application as superimposed of such a high surge voltage that may result in a dielectric breakdown to the gate of the MOS FET 15 will cause the transistor 17 to be shifted to its low impedance state to absorb the surge voltage even in the state where the gate is cut off, and the gate of the MOS FET 15 can be effectively protected.

When the input current provided between the input terminals 11 and 11a is cut off, on the other hand, the light-emitting element 12 emits no light and no voltage is generated across the terminals of the photovoltaic diode array 13, and the current supplied to the impedance element 14 and transistor 17 is cut, whereby the gate of the transistor 17 is no more biased to result in that the transistor 17 which has been in the high impedance state returns to the ON state of low impedance. The stored charge having been accumulated between the gate and substrate of the MOS FET 15 is discharged through the transistor 17, upon which no current flows through the impedance element 14, so that the gate of the transistor 17 is no more biased to be the negative voltage and the transistor 17 continuously maintains its ON state. While it depends on the gate cut-off voltage characteristics of the transistor 17 and the impedance characteristics of the impedance element 14, the discharge of the stored charge is completed in a relatively short time in the order of several ten to several hundred μs. Immediately after the completion of the discharge, the impedance between the output terminals of the MOS FET returns to the first impedance state. When the impedance element 14 in the foregoing arrangement has a large impedance value and the stored charge accumulated between the gate and substrate of the transistor 17 itself tends to cause any operational problem, a separate discharging path is provided in parallel to the impedance element 14.

In the case where no input current flows across the input terminals 11 and 11a and the MOS FET 15 is in its enhancement mode, even a large variation in the voltage across the output terminals 16 and 16a will not result in any instantaneous erroneous triggering since any stored charge accumulated between the drain and gate of the MOS FET 15 due to a Mirror's current is caused to be discharged to the substrate of the MOS FET 15 through such transistor 17 as the normally ON SIT or the depletion mode FET. When the N-channel type transistor, in particular, the N-channel SIT is used as the transistor 17, the impedance element 14 causes a current flowing into the photovoltaic diode array 13 to be positively supplied between the gate and source of the transistor 17 so that the transistor 17 is operated in its BSIT (bipolar-mode static induction transistor) mode to further reduce the impedance of the MOS FET 15 between the gate and substrate, and the discharge of the charge in parasitic capacitance can be accelerated. When the transistor 17 is of the N-channel type, there arises an advantage that required manufacturing steps for the relay in a one chip arrangement are not made to be complicated.

When a P-channel type SIT or FET, for example, is used as the transistor 17, it is difficult to shorten the parasitic capacitance discharging time. That is, the transistor 17 in this case is operated with the diode 14 inserted as the impedance element between the gate of the MOS FET 15 and the diode array 13, the current to be sent to the photovoltaic diode array 13 is thereby subjected to the rectification by the diode 14 to be blocked, and the discharging of the parasitic capacitance in the short time cannot be achieved. Manufacturing steps of such transistor having the gate cut-off characteristics at a lower voltage as required for use in the foregoing arrangement will be made clear in a later description of the manufacturing steps.

Figure 2:
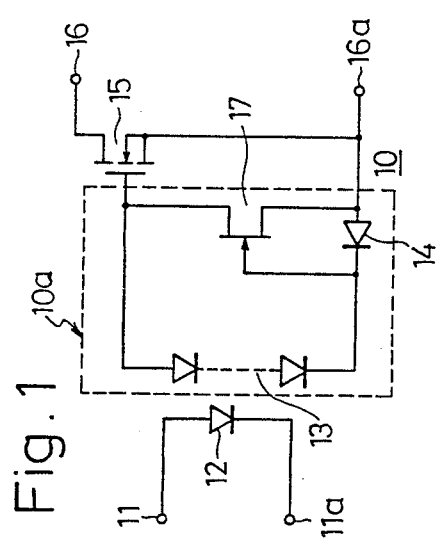
FIG. 2 is a plan view of a practical example of a light-receiving and driving circuit section formed in one chip of the solid state relay of FIG. 1.

Such a portion of the solid state relay 10 as enclosed in a dotted line 10a in FIG. 1 which including the photovoltaic diode array 13, impedance element 14 and transistor 17 and forming a light-receiving and driving section should preferably be prepared in the form of such a one chip as shown in FIG. 2. In this case, wiring pads 18 and 18a connected to the gate and substrate of the MOS FET 15 are provided onto a chip 19, and connected to the diode array 13 and impedance element 14, respectively. The impedance element 14 and transistor 17 are coated preferably with a wiring aluminum film 20 or the like for light shielding. When a diode is used as the impedance element 14, required occupation area for the relay can be remarkably reduced as compared with the case of using a resistance, and the use of the diode is optimum in attempting, in particular, a microminiaturization in the form of one chip.

Figure 3:
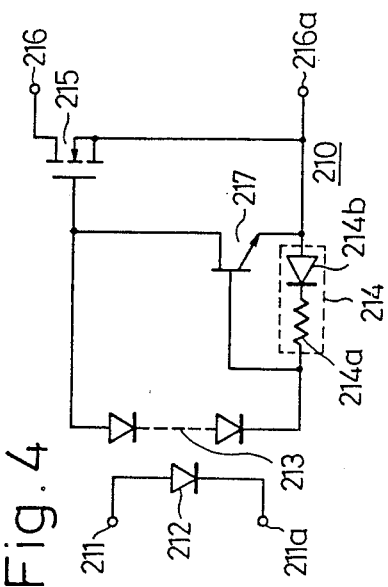
FIGS. 3 and 4 are circuit diagrams of other embodiments of the solid state relay according to the present invention, respectively.

If, on the other hand, it is not required to make the light-receiving and driving section 10a in the one chip or to miniaturize the relay, the diode can be replaced by such an inexpensive resistance 114 as shown in another embodiment of FIG. 3, in which the same elements as those in FIG. 1 are denoted by the same reference numerals but added by 100 and arrangement and operation of its solid state relay are substantially the same as those of the embodiment of FIG. 1.

Figure 4:
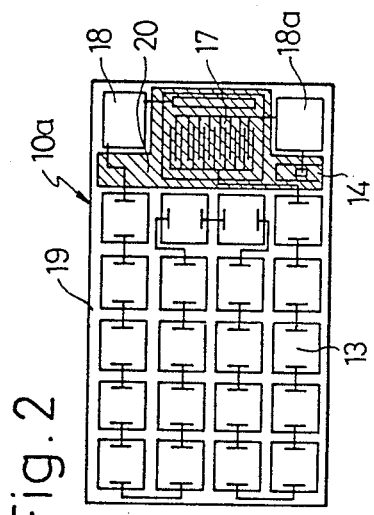

When it is necessary to provide a large negative voltage to the gate of the transistor depending on the gate cut-off characteristics of the transistor, a series circuit of a resistance 214a and a diode 214b can be provided as an impedance element 214, as shown in another embodiment of FIG. 4 in which the same elements as those in the embodiment of FIG. 1 are denoted by the same reference numerals but added by 200 and arrangement and operation as the solid state realy are substantially the same as those of the embodiment of FIG. 1.

Next, detailed explanation will be made as to the steps of manufacturing the portion enclosed in the dotted line in FIG. 1 in the form of such a one chip as shown in FIG. 2, with reference to FIG. 6:

(A) As shown in FIG. 6(a), an N-type, high impurity concentration layer 22 is grown on an N-type low impurity concentration single crystal silicon substrate 21 by an epitaxial crystalline growth technique. In the illustrated embodiment, the single crystal silicon substrate 21 is selected to have a resistivity of several ten to several hundred Ωcm, and higher impurity layer 22 is set to have a resistivity of nearly zero Ωcm and a thickness of several ten μm.

(B) as shown in FIG. 6(b), higher impurity layer 22 formed through the epitaxial crystal growth in the step of FIG. 6(a) is provided thereon with a silicon dioxide (SiO$_2$) film by a known semiconductor processing method, the oxide film is etched at desired locations by known photographic and oxide film etching techniques, and then is subjected to an anisotropic etching with use of a silicon crystal alkaline anisotropic solution (typically a mixture solution of 46.4 mol % of ethylenediamine, 4 mol % of pyrocatechol and 4.6 mol % of water, and is heated to its boiling point 118° C. within a flask equipped with a reflux condenser) to form a plurality of grooves 23 V-shaped in section. In this case, the depth of the V-shaped grooves 23 is set to be such an extent that the bottom ends of the grooves reach the interior of the single crystal silicon substrate 21.

(C) As shown in FIG. 6(c), an N-type high impuring diffused layer 24 is formed by a known semiconductor processing method on the entire surface of higher impurity layer 22 made in the step of FIG. 6(a) including the V-shaped grooves 23 made in the step of FIG. 6(b).

(D) As shown in FIG. 6(d), an insulating film 25 made of silicon dioxide film (preferably of SiO$_2$) is formed on the entire surface of the doping layer 24 made in the step of FIG. 6(c). In the illustrated embodiment, the film 25 is sufficient to function merely as an insulating film and may be coated with Si$_3$N$_4$ or the like.

(E) As shown in FIG. 6(e), a polycrystalline silicon layer 26 functioning as a carrier is formed on the insulating film 25 made in the step of FIG. 6(d). The thickness of the polycrystalline silicon layer 26 is set desirably to be nearly equal to that of, for example, single crystal silicon substrate 21.

(F) As shown in FIG. 6(f), a laminate obtained in the step of FIG. 6(e) is subjected to a surface abrasion from the side of the single crystal silicon substrate 21 to remove a zone P shown in FIG. 6(e). In performing the surface abrasion, the laminate is subjected initially to rough lapping, to finer lapping and finally to polishing to obtain a mirror finish.

It will be clear that the chip obtained through the foregoing steps A to F is a dielectric-isolated substrate which includes a plurality of single crystal silicon layers 21a enveloped by the insulating film 25 and in the form of islands on the polycrystalline silicon layer 26. In this case, each single crystal silicon layer 21a is formed to have a single crystal layer of low impurity concentration on one side and have a single crystal area of high impurity concentration on the other side and its periphery. Depending on the depth of the V-shaped grooves 23, the step A can be omitted, that is, the N-type high doping layer 22 may not be provided and the single crystal area of high doping on the other side and periphery may be formed only with the N-type high doping area 24 of the step C.

In the chip, i.e., the dielectric-isolated substrate, the photovoltaic diode array 13 can be formed, a unit diode of which array will be as shown in FIGS. 7 and 8. In this case, the N-type high impurity concentration layer 22 (or the N-type high doping area 24) is used as the cathode layer of the respective diodes, and adjacent two of the cathode layers are connected to each other by an aluminum wiring electrode part 28 through the N-type high doping area 24 and an N-type diffusion layer 27 formed on the chip. P-type diffusion layers 29 are formed on the chip to be used as the anode areas of the diodes, and adjacent two of the diffusion layers 29 are interconnected by an aluminum wiring electrode part 28a. When a plurality of such unit diodes are interconnected in this way, the photovoltaic diode array 13 can be formed. Since, in this case, the unit diodes of the diode array 13 are separated as isolated from each other, there arises no leak due to the parasitic components in contrast to a case of P-N junction isolation, and it is made possible to generate a high voltage. Further, the use of the substrate 21 of the N-type low impurity concentration enables the diode array to generate a high level of photovoltaic output.

With the above dielectric-isolated substrate, such a static induction transistor (SIT) as shown in FIGS. 9 and 10 can be formed. In this case, P-type diffusion layers 30 are formed as the gate of the SIT on the single crystal silicon layer 21a and N-type diffusion layers 31 as the source of the SIT are made of polycrystalline silicon doped with a high impurity concentration N-type. Electrodes 32 of the N-type diffusion layers 31 are also made of polycrystalline silicon and connected to an aluminum wiring part 33. An aluminum wiring part 34 as an electrode of the P-type diffusion layers 30 is formed in a interdegital shape. The drain of the SIT is connected to an aluminum wiring electrode part 35 through the N-type high impurity concentration layer 22, N-type high doping area 24 and N-type diffusion layer formed on the substrate. It is preferable in this case that the impedance element 14 and such transistor 17 as the SIT in FIG. 2 are covered with a passivation film 36 and further with the aluminum film 20 for light shielding.

When a junction type FET is employed as the transistor 17 in the one-chip as shown in FIG. 2, it is preferable to use the following manufacturing steps. Referring to FIG. 11:

(I) As shown in FIG. 11(a), a semiconductor single crystal layer 50 is formed on one side of the polycrystalline silicon layer 26 as the carrier, with the insulating film 25 interposed between them, to obtain a dielectric-separated substrate.

(II) As shown in FIG. 11(b), a selective N-type epitaxial layer 51 is formed on the substrate prepared in the step of FIG. 11(a) at a selective area where the FET is desired to be formed.

(III) As shown in FIG. 11(c), P-type layers 51a are formed in the epitaxial layer 51 formed in the step of FIG. 11(b) as diffused from top surface of the layer, and these P-type layers 51a are joined to the P-type single crystal layer 50 through a P-type diffusion layers 52 to form a gate of the FET. At the same time, N-type layers 51b are formed also in the epitaxial layer 51 as diffused from the top surface, electrodes 51c are attached onto the N-type diffusion layers 51b to form the drain and source of the FET, and a double-coating is formed with a passivation film 53 and further the aluminum film 20 for light shielding.

When such FET as shown in FIG. 11(c) is used as the transistor 17, the photovoltaic diode array 13 is prepared as shown in FIG. 12 by forming an N-type diffusion layer 54 as a cathode on the semiconductor single crystal layer 50 of the dielectric-separated substrate obtained in the step of FIG. 11(a), connecting anodes and cathodes of adjacent unit diodes respectively through aluminum wiring parts 55 and 55a, and then forming a silicon oxide film 56 on the N and P type diffusion layers 50 and 54 to coat them.

It will be readily appreciated by those skilled in the art that the foregoing light-receiving and driving section 10a obtainable in the one-chip formation through the manufacturing steps referred to in the above can be integralized with the light-emitting diode and MOS FET into a hybrid IC device, and thereby the solid state relay which can be manufactured through remarkably simplified steps and thus in a mass production to be inexpensive is made obtainable.

What is claimed as my invention is:

1. A method of manufacturing a solid state relay, the method comprising the steps of forming a first high impurity concentration layer on one side of a low impurity concentration single crystal substrate layer; forming a plurality of grooves penetrating through said first high impurity concentration layer into said single crystal substrate; forming a second high impurity concentration layer over the entire surface of said first high impurity concentration layer and said grooves; coating said second high impurity concentration layer with an insulating film over its entire surface; forming a carrier layer on said insulating film; preparing a dielectric-isolated substrate by abrading said low impurity concentration single crystal substrate layer from a reverse side thereof, so that the first and second high impurity concentration layers will appear in the form of a plurality of islands mutually isolated by said carrier layer filling said plurality of grooves and electrically isolated by said insulating film with said single crystal substrate layer appearing between respective said islands; and forming with said first and second high impurity concentration layers of the respective islands a plurality of diodes of a photovoltaic diode array for optical coupling to a light emitting element and for generating a photovoltaic output to be applied across gate and substrate electrodes of an output MOS FET, an impedance element being connected to both end terminals of said photovoltaic diode array and to said gate and substrate electrode of said MOS FET, and a normally ON driving transistor to be biased to be in a high impedance state by a voltage drop across said impedance element due to a current flowing through the impedance element.

2. A method according to claim 1, wherein said low impurity concentration single crystal substrate layer is N-type, and said driving transistor is a static induction transistor having a gate and source, respectively, of a P-type conductivity layer and an N-type high concentration diffusion layer, formed in said low impurity concentraiton single crystal layer exposed by said abrading in said substrate preparing step, and having a drain of an N-type high impurity concentration layer formed in the periphery of said low impurity concentration single crystal substrate layer.

3. A method according to claim 1, wherein said low impurity concentration single crystal substrate layer is N-type, and each of said diodes of said photovoltaic diode array is formed on said N-type substrate layer to have an anode of a P-type diffusion layer formed on a part of the N-type substrate layer excluding a partial layer exposed by said abrading in said substrate preparing step, a cathode of an N-type diffusion layer formed in said partial layer, and an N-type high impurity concentration layer formed in the periphery of said anode layer.

4. A method according to claim 1, wherein said low impurity concentration single crystal substrate layer is N-type, said driving transistor is a static induction transistor having a gate and source, respectively, of a P-type conductivity layer and an N-type high concentration diffusion layer, formed in said N-type substrate layer exposed by said abrading in said substrate preparing step, and having a drain of an N-type high impurity concentration layer formed in the periphery of said exposed N-type substrate layer; and said diodes of said photovoltaic diode array as well as said impedance element, which comprises a diode, are formed on said substrate to have an anode of a P-type diffusion layer formed on a part of the exposed N-type substrate layer excluding a partial layer, a cathode of an N-type diffusion layer formed in said partial layer, and an N-type high impurity concentration layer formed in the periphery of said anode layer; said driving transistor and said diodes forming said photovoltaic diode array and, together with said impedance element, being formed as one chip.

5. A method according to claim 4, wherein said transistor is connected at said drain layer to said anode side of said photovoltaic diode array, at said source layer to said anode of said diode that forms said impedance element, and at said gate layer to said cathode side of both the diode array and the impedance-element diode; and wherein said drain and source of the transistor are connected to electrode pads, and the transistor and impedance-element diode are coated with a light shielding means.

* * * * *